(12) United States Patent
Li et al.

(10) Patent No.: US 8,218,277 B2
(45) Date of Patent: Jul. 10, 2012

(54) SHARED ELECTROSTATIC DISCHARGE PROTECTION FOR INTEGRATED CIRCUIT OUTPUT DRIVERS

(75) Inventors: Richard C. Li, San Jose, CA (US); James Karp, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 353 days.

(21) Appl. No.: 12/555,598

(22) Filed: Sep. 8, 2009

(65) Prior Publication Data
US 2011/0058290 A1 Mar. 10, 2011

(51) Int. Cl.
*H02H 9/00* (2006.01)
(52) U.S. Cl. .......... 361/56; 361/91.1; 361/111; 257/355
(58) Field of Classification Search ........... 257/355–360
See application file for complete search history.

(56) References Cited

U.S. PATENT DOCUMENTS

| | | |
|---|---|---|
| 6,526,548 B1 | 2/2003 | Voldman |
| 2003/0189230 A1* | 10/2003 | Hung et al. .................. 257/355 |
| 2006/0026547 A1 | 2/2006 | Aggarwal |
| 2006/0091465 A1* | 5/2006 | Chen ........................... 257/360 |
| 2007/0246737 A1 | 10/2007 | Chang |
| 2009/0070718 A1* | 3/2009 | Voldman ........................ 716/5 |

FOREIGN PATENT DOCUMENTS
EP    0 948 051 A2    10/1999

OTHER PUBLICATIONS

Ma, Qiang et al., "Analog Placement with Common Centroid Constraints," *Proc. of the 2007 IEEE/ACM International Conference on Computer-Aided Design*, Nov. 4, 2007, IEEE Press, Piscataway, New Jersey, USA.

\* cited by examiner

*Primary Examiner* — Jared Fureman
*Assistant Examiner* — Terrence Willoughby
(74) *Attorney, Agent, or Firm* — Kevin T. Cuenot

(57) ABSTRACT

A system for protecting metal oxide semiconductor field effect transistor (MOSFET) output drivers within an integrated circuit (IC) from an electrostatic discharge (ESD) includes a first MOSFET output driver and a second MOSFET output driver positioned within a common IC diffusion material. The system includes a contact ring coupled to the common IC diffusion material and arranged along an outer edge of a perimeter surrounding the MOSFET output drivers. A centroid of each MOSFET output driver is common with a centroid of the perimeter surrounding both MOSFET output drivers. Each MOSFET output driver has a value of substrate resistance ($R_{sub}$) that initiates bipolar snapback in the MOSFET output driver at which an ESD event occurs. The value of $R_{sub}$ depends upon a composite distance from the centroid of each MOSFET output driver to the contact ring.

20 Claims, 5 Drawing Sheets

SHARED ELECTROSTATIC DISCHARGE PROTECTION FOR INTEGRATED CIRCUIT OUTPUT DRIVERS

FIELD OF THE INVENTION

The embodiments disclosed within this specification relate to integrated circuit devices (ICs). More particularly, the embodiments relate to electrostatic discharge protection for output drivers within ICs.

BACKGROUND

An electrostatic discharge (ESD) event refers to a temporary and abrupt flow of current between two objects of differing electrical potentials. ESD can be a serious issue for an integrated circuit device (IC), as large potential changes and current flows that occur during the ESD event can damage silicon junctions and oxide insulators. Damage to an IC from the ESD event can diminish the performance of the silicon-based IC, if not render the IC inoperable.

A buildup of charge on an IC may occur for a variety of different reasons, many of which occur during the manufacturing, assembly, testing, or use of the IC. As a result, an IC may be subjected to inadvertent ESD events prior, and subsequent, to assembly and sale. ESD protection schemes are implemented to protect devices internal to the IC which may be vulnerable to ESD events. These vulnerable devices are typically devices that output to, or come in contact with, external nodes of the IC. ESD protection schemes, when enabled during the ESD event, provide alternative current pathways for large currents generated during the ESD event. These alternative pathways attempt to steer current around vulnerable devices, effectively bypassing the ESD sensitive sections of the IC.

When a metal oxide semiconductor field effect transistor (MOSFET) device is used as an output driver, a drain terminal of the MOSFET device is coupled to an output pad. In this configuration, the MOSFET device is exposed to the external environment via the output pad. Such exposure makes the MOSFET device vulnerable to ESD events. One approach to protecting a MOSFET device from ESD events takes advantage of a parasitic bipolar junction transistor inherent in the structure of the MOSFET device. For example, within the structure of an N-type MOSFET (NFET) device resides a parasitic N-P-N bipolar junction transistor (parasitic BJT). Typically, the parasitic BJT is not a highly effective device and, as such, does not function during normal operation of the NFET device. However, the high voltage potentials generated during an ESD event can initiate a snapback mode in the NFET device, thereby enabling the parasitic BJT. When the NFET operates in snapback mode, the parasitic BJT has a high current carrying capacity and can safely bypass current generated by the ESD event through the NFET device structure. When properly sized, the parasitic BJT can provide ESD protection to the NFET device without degrading the intended functionality of the NFET device.

SUMMARY

The embodiments disclosed within this specification relate to integrated circuit devices (ICs), and more particularly, to protecting circuits within an IC from electrostatic discharge (ESD) events. One embodiment of the present invention can include a system for protecting metal oxide semiconductor field effect transistor (MOSFET) output drivers within an IC from an ESD event. The system can include a first MOSFET output driver and a second MOSFET output driver positioned within a common IC diffusion material. The system can include a contact ring disposed within the common IC diffusion material and arranged along an outer edge of a perimeter surrounding the first MOSFET output driver and the second MOSFET output driver. A centroid of each MOSFET output driver is common with a centroid of the perimeter surrounding the first MOSFET output driver and the second MOSFET output driver. Each MOSFET output driver has a value of substrate resistance ($R_{sub}$) that initiates bipolar snapback in the MOSFET output driver at which an ESD event occurs, and wherein the value of $R_{sub}$ depends upon a composite distance from the centroid of each MOSFET output driver to the contact ring.

In another aspect, the first MOSFET output driver and the second MOSFET output driver each can be formed of a same number of drain terminals, wherein the number of drain terminals is greater than one. The drain terminals of the first MOSFET output driver and the second MOSFET output driver can be interdigitated. Further, each of the plurality of drain terminals of each of the MOSFET output drivers can be ballasted.

In another aspect, the first MOSFET output driver and the second MOSFET output driver each can be formed of a same number of source terminals, wherein the number of source terminals is greater than one. The contact ring and each source terminal of each MOSFET output driver can be coupled to a voltage associated with a particular diffusion type of the common IC diffusion material.

The common IC diffusion material can be a P-type material and the MOSFET output driver can be an NFET device. Accordingly, the contact ring and each source terminal of each MOSFET output driver can be coupled to a lowest voltage potential supplying the IC. Alternatively, the common IC diffusion material can be an N-type material and the MOSFET output driver can be a PFET device. In that case, the contact ring and each source terminal of each MOSFET output driver can be coupled to a highest voltage potential supplying the IC.

The system further can include a first output pad coupled to at least one drain terminal of the first MOSFET output driver and a second output pad coupled to at least one drain terminal of the second MOSFET output driver.

Another embodiment of the present invention can include a system for protecting MOSFET output drivers within an IC from an ESD event. The system can include a first MOSFET output driver and a second MOSFET output driver positioned within a common IC diffusion material. Each MOSFET output driver comprises an array of MOSFET devices, wherein the MOSFET devices are positioned adjacent to each other, and wherein adjacent MOSFET devices alternate between MOSFET devices of the first MOSFET output driver and MOSFET devices of the second MOSFET output driver. The system can include a contact ring disposed within the common IC diffusion material and arranged along an outer edge of a perimeter surrounding the first and the second MOSFET output drivers. A centroid of each array of MOSFET devices is common with a centroid of the perimeter surrounding the first MOSFET output driver and the second MOSFET output driver. Each MOSFET output driver can have a value of $R_{sub}$ that initiates bipolar snapback in the MOSFET output driver at which the ESD event occurs. The value of $R_{sub}$ depends upon a composite distance from the centroid of each MOSFET output driver to the contact ring.

In one aspect, each drain terminal of each MOSFET device can be ballasted. The contact ring and each source terminal of each MOSFET device can be coupled to a voltage associated with a particular diffusion type of the common IC diffusion material.

In another aspect, the common IC diffusion material can be a P-type material and the MOSFET output driver can be an NFET device. Accordingly, the contact ring and each source terminal of each MOSFET device can be coupled to a lowest voltage potential supplying the IC. Alternatively, the common IC diffusion material can be an N-type material and the MOSFET output driver can be a PFET device. In that case, the contact ring and each source terminal of each MOSFET device can be coupled to a highest voltage potential supplying the IC.

Another embodiment of the present invention can include a method of ESD protection for MOSFET output drivers within an IC. The method can include disposing a first MOSFET output driver and a second MOSFET output driver within a common IC diffusion material, determining a perimeter surrounding the first MOSFET output driver and the second MOSFET output driver, and disposing a contact ring within the common IC diffusion material along an outer edge of the perimeter. The method further can include positioning each MOSFET output driver to have a centroid common with a centroid of the perimeter and have a value of $R_{sub}$ that initiates bipolar snapback in the MOSFET output driver at which an ESD event occurs. The value of $R_{sub}$ depends upon a composite distance from the centroid of each MOSFET output driver to the contact ring.

Each MOSFET output driver can be implemented with a same number of drain terminals, wherein the number of drain terminals is greater than one. The drain terminals of the MOSFET output drivers can be interdigitated. In addition, each of the drain terminals of each of the MOSFET output drivers can be ballasted. The contact ring and each source terminal of each MOSFET output driver can be coupled to a voltage associated with a particular diffusion type of the common IC diffusion material.

In one aspect, the common IC diffusion material can be a P-type material and the MOSFET output driver can be an NFET device. Accordingly, coupling the contact ring and each source terminal of each MOSFET output driver can include coupling the contact ring and each source terminal of each MOSFET output driver to a lowest voltage potential supplying the IC. Alternatively, the common IC diffusion material can be an N-type material and the MOSFET output driver can be a PFET device. In that case, coupling the contact ring and each source terminal of each MOSFET output driver can include coupling the contact ring and each source terminal of each MOSFET output driver to a highest voltage potential supplying the IC.

The method further can include coupling a first output pad to at least one drain terminal of the first MOSFET output driver and coupling a second output pad to at least one drain terminal of the second MOSFET output driver.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the embodiments of the invention.

The embodiments disclosed within this specification relate to electrostatic discharge (ESD) protection for an integrated circuit device (IC). More particularly, the embodiments provide an ESD protection system and method for use with output drivers within an IC comprising metal oxide semiconductor field effect transistor (MOSFET) devices. In accordance with the inventive arrangements disclosed herein, two or more MOSFET output drivers can be arranged within a common IC material. The MOSFET output drivers can be arranged so that the terminals of each MOSFET output driver alternate. Arranging two or more MOSFET output drivers symmetrically within a common IC material can increase a value of a substrate resistance, denoted as $R_{sub}$, of each MOSFET output driver. With the MOSFET output divers symmetrically sharing the common IC material, the value of $R_{sub}$ of each MOSFET output driver is approximately equal. Increasing the value of $R_{sub}$ of each MOSFET output driver can increase susceptibility of the driver to bipolar snapback. The increased susceptibility of the MOSFET output driver to bipolar snapback can be leveraged as an ESD protection mechanism for the MOSFET output drivers.

Figure 1:
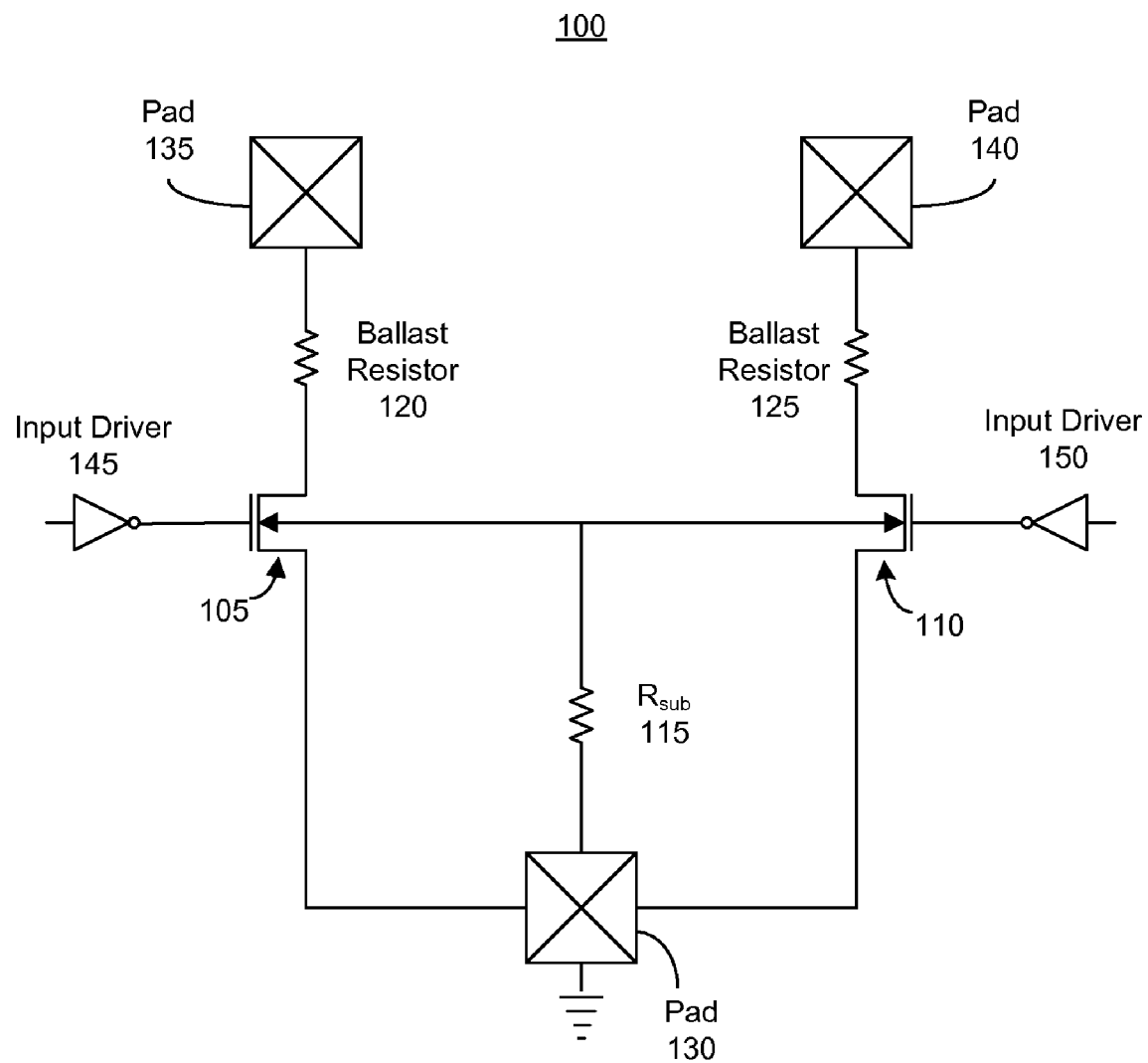
FIG. 1 is a first schematic diagram illustrating an electrostatic discharge (ESD) protection system in accordance with one embodiment of the present invention.

FIG. 1 is a first schematic diagram illustrating an ESD protection system 100 in accordance with one embodiment of the present invention. More particularly, ESD protection system 100 provides ESD protection to MOSFET output drivers implemented within an IC. ESD protection system 100 includes a MOSFET output driver (MOSFET) 105, a MOSFET 110, a substrate resistance, denoted as $R_{sub}$ 115, and ballast resistors 120 and 125.

Each of MOSFETs 105 and 110 is implemented as an N-type MOSFET (NFET) device. MOSFETs 105 and 110 each can serve as an independent output driver to a node external to the IC within which MOSFETs 105 and 110 are implemented. MOSFET 105 is coupled to pad 135 through ballast resistor 120. MOSFET 110 is coupled to pad 140 through ballast resistor 125. Pads 135 and 140 can couple MOSFETs 105 and 110 to nodes external to the IC. Ballast resistors 120 and 125 provide ESD protection to MOSFETs 105 and 110, respectively.

Although MOSFETs 105 and 110 are independent output drivers, both can be positioned within a common IC diffusion material (not shown in FIG. 1). A contact ring (not shown in FIG. 1) coupled to the common IC diffusion material is arranged along an outer edge of a perimeter surrounding MOSFETs 105 and 110. $R_{sub}$ 115 represents a parallel resistance of a path from each drain terminal of each of MOSFETs 105 and 110, through the common IC diffusion material within which MOFETs 105 and 110 are positioned, to the contact ring. As MOSFETs 105 and 110 symmetrically share the common IC material, the value of $R_{sub}$ for each MOSFET output driver is approximately equal and $R_{sub}$ 115 represents the value of $R_{sub}$ for each of MOSFETs 105 and 110 in parallel. The contact ring is coupled to pad 130, which is coupled to ground. A gate terminal of MOSFET 105 is driven by input driver 145. Similarly, a gate terminal of MOSFET 110 is driven by input driver 150. Input drivers 145 and 150 each represent circuits internal to the IC within which MOSFETs 105 and 110 are implemented.

In a conventional MOSFET output driver circuit, one MOSFET output driver is disposed within one region of IC diffusion material. Further, each MOSFET output driver typically exists as a single MOSFET device within that region of IC diffusion material. Each MOSFET output driver can be encompassed by a contact ring that couples to the IC diffusion material within which the MOSFET output driver is disposed. Arranged in this manner, $R_{sub}$ for each MOSFET output driver is unique and dependent upon the dimensions and material type of the region of IC diffusion material within which the MOSFET output driver is disposed. The smaller the dimensions of the IC diffusion material surrounding the MOSFET output driver, the smaller the value of $R_{sub}$ for the MOSFET output driver.

Since only a single MOSFET device is positioned within the region of IC diffusion material of a conventional MOSFET output driver, the value of $R_{sub}$ for the conventional output driver is less than the value of $R_{sub}$ 115 for ESD protection system 100 that positions two MOSFET output drivers within a common region of IC diffusion material. Accordingly, when the MOSFET devices used to implement a conventional MOSFET output driver and ESD protection scheme 100 are of a same size, the area of the region of IC diffusion material within which ESD protection scheme 100 is disposed is greater than the region of IC diffusion material within which the conventional MOSFET output driver is disposed. Thus, given same sized MOSFET devices, the value of $R_{sub}$ 115 achieved for ESD protection scheme 100 is greater than the value of $R_{sub}$ for the conventional MOSFET output driver.

As will be described later within this specification, $R_{sub}$ is correlated with a probability of a MOSFET device entering a snapback mode of operation (snapback mode). During an ESD event, when a MOSFET output driver enters snapback mode, a parasitic bipolar junction transistor (parasitic BJT) within the MOSFET device is enabled. The parasitic BJT leads current generated by the ESD event away from the MOSFET output driver. The inducement of snapback mode in a MOSFET output driver during an ESD event protects the MOSFET output driver from damaging currents and voltage potentials generated by the ESD event. ESD protection system 100, having a value of $R_{sub}$ for each MOSFET output driver within the common region of IC diffusion material, that is greater than a conventional MOSFET output driver, can provide greater ESD protection than the conventional MOSFET output driver.

Figure 2:
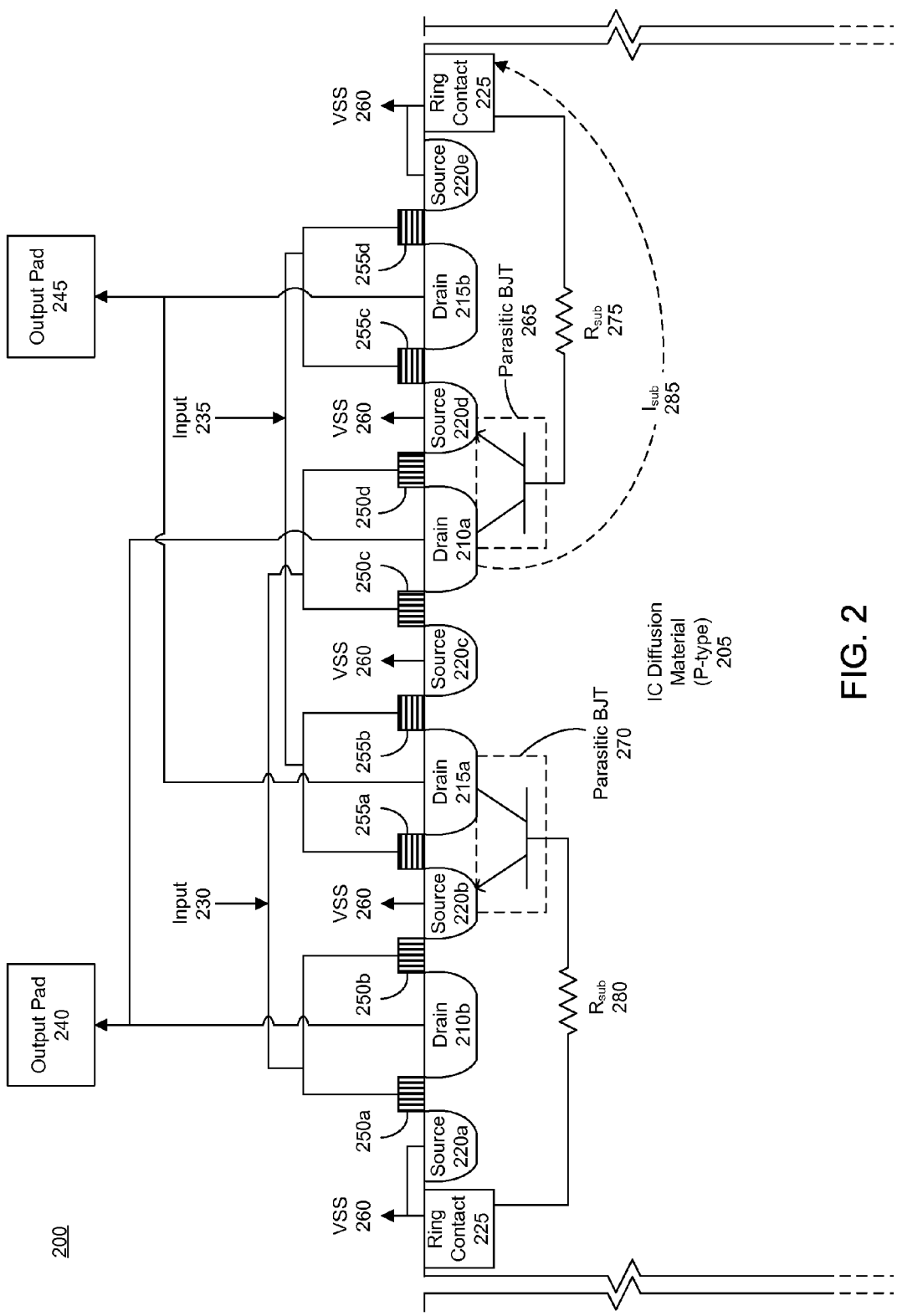
FIG. 2 is a second schematic diagram illustrating a cross-sectional side view of an integrated circuit (IC) including an ESD protection system in accordance with another embodiment of the present invention.

FIG. 2 is a second schematic diagram illustrating a cross-sectional side view of a portion of an IC including an ESD protection system 200 in accordance with one embodiment of the present invention. ESD protection system 200, as illustrated in FIG. 2, includes two MOSFET output drivers implemented as NFET devices, positioned within, and symmetrically sharing, a common IC diffusion material 205. In the example pictured in FIG. 2, IC diffusion material 205 is a P-type material.

As pictured in FIG. 2, two MOSFET output drivers are implemented as a single NFET device structure with a series of drain terminals interspersed with a series of shared source terminals positioned within a common portion or region of IC diffusion material 205 (hereafter "common IC diffusion material"). It should be noted that positioning two MOSFET devices within a symmetrically shared common IC diffusion material differs from a conventional MOSFET output driver that contains only a single MOSFET device within the IC diffusion material. In general, alternating drain terminals of the NFET device structure are coupled in parallel to form two separate drain terminals. Each of the two separate drain terminals can serve as a drain terminal for one of the two MOSFET output drivers. Each drain terminal can be coupled to an output pad. As the source terminals of the NFET structure are shared between the two MOSFET output drivers, all source terminals can be coupled to a lowest voltage potential supplying the IC.

With reference to FIG. 2, a first MOSFET output driver is implemented with drains 210a and 210b coupled in parallel to output pad 240. Each of output pads 240 and 245 can be an output pad through which the IC is coupled to an external environment, potentially exposing the MOSFET output drivers to an ESD event. Gates 250a, 250b, 250c, and 250d are coupled in parallel to input 230 and function as a single gate input. Upon an appropriate voltage being applied through input 230 to gates 250a-250d, current can begin flowing from drain 210a to sources 220c and 220d, and from drain 210b to sources 220a and 220b. Operated in this manner, drains 210a and 210b, gates 250a-250d, and sources 220a-220d, can function as a single NFET device to implement the first MOSFET output driver of ESD protection system 200.

Similarly, drains 215a and 215b are coupled in parallel to output pad 245. Gates 255a, 255b, 255c, and 255d are coupled in parallel to input 235 and function as a single gate input. Upon an appropriate voltage being applied through input 235 to gates 255a-255d, current can begin flowing from drain 215a to sources 220b and 220c, and from drain 215b to sources 220d and 220e. Accordingly, drains 215a and 215b, gates 255a-255d, and sources 220b-220e can function as a single NFET device to implement the second MOSFET output driver of ESD protection system 200.

It should be noted that each of sources 220b-220d serves as a common source terminal for both the first and the second MOSFET output drivers. Source 220b, for example, can receive current flow from both drains 210b and 215a. The sharing of source terminals between the two MOSFET output drivers can reduce the area required to implement ESD protection system 200 as the number of source terminals required to implement the two MOSFET output drivers is reduced. Reducing the area occupied by ESD protection system 200 can reduce the total die area required for an IC incorporating ESD protection system 200.

Contact ring 225 can be implemented as one or more contacts disposed within, and coupled to, common IC diffusion material 205. As pictured in FIG. 2, contact ring 225 is implemented as a single, continuous, ring-shaped contact shown in cross-section. Alternatively, contact ring 225 can be formed of a plurality of individual contacts arranged in a ring shape. In that case, the contacts of contact ring 225 can be evenly distributed along the perimeter surrounding both MOSFET output drivers to provide a nearly equally low impedance path from all points within common IC diffusion material 205 through to the voltage source VSS 260.

Whether formed as a single contact or a plurality of contacts, contact ring 225 can be formed along an outer edge of a perimeter surrounding the first and second MOSFET output drivers of FIG. 2. When ESD protection system 200 is implemented within a well of common IC diffusion material 205, contact ring 225 can be arranged along the outer edge of the perimeter surrounding both MOSFET output drivers and within the inner perimeter of the well.

As used within this specification, a "contact" refers to a physical IC structure that electrically couples an IC layer or device to a metal layer through which the IC layer or device can be coupled to other structures within the IC. Contacts can include one or more IC process layer(s). For example, a contact to a diffusion layer can include diffusion material and metal material to create an electrical coupling between the diffusion layer and metal interconnect layers of the IC.

Accordingly, contact ring 225 can couple common IC diffusion material 205 to a desired voltage potential, for example VSS 260, via a metal interconnect line (not shown) coupled to contact ring 225. Typically, N-type material is coupled to the highest voltage potential provided to an IC, while P-type material is typically coupled to the lowest voltage potential provided to the IC. VSS 260 can be set to a preferred or predetermined voltage potential at which common IC diffusion material 205 is to operate.

Within the structure of each MOSFET device resides a parasitic BJT. Parasitic BJT 265 represents a parasitic BJT that is inherent in the structure of the first MOSFET output driver. Parasitic BJT 270 represents a parasitic BJT that is inherent in the structure of the second MOSFET output driver. It should be noted that any N-P-N structure within an NFET device can potentially form a parasitic BJT. Accordingly, depending upon the structure of the MOSFET output driver, multiple parasitic BJTs may exist within a single MOSFET output driver. As such, for illustration purposes, each of parasitic BJTs 265 and 270 can represent one or more possible parasitic BJT(s) that may exist within each of the MOSFET output drivers.

Within an IC, each MOSFET device typically is designed to minimize the ability of the parasitic BJT to conduct current during normal operation of the MOSFET device. Modern CMOS manufacturing processes seek to reduce the substrate resistance, denoted as $R_{sub}$, of a MOSFET device. Reducing the value of $R_{sub}$ of each MOSFET device can reduce the probability of the parasitic BJT entering snapback mode and conducting current during normal operation of the MOSFET device.

As used within this specification, "snapback" or "snapback mode" refers to a high current operation mode wherein a parasitic BJT within a MOSFET device becomes operable. Inducing a parasitic BJT into snapback mode requires the occurrence of several sequential events. First, a large voltage potential, e.g., an ESD event, must be applied at a drain terminal of a MOSFET device. When the applied voltage is large enough, avalanche breakdown can occur at any reverse biased P-N junction associated with the drain terminal. With regard to FIG. 2, for example, avalanche breakdown can occur across the P-N junction between drain 210a and common IC diffusion material 205 when a high voltage potential is applied drain 210a. Avalanche breakdown can occur when an electric field across the reverse biased P-N junction is large enough to accelerate electrons across the P-N junction. As the high energy electrons move across the P-N junction, the electrons impact other electrons. The high energy state of the electrons can dislodge the impacted electrons from their bonds. The dislodged electrons then can dislodge other electrons creating an avalanche effect.

In general, avalanche breakdown can generate a current flow, denoted as $I_{sub}$, from the drain terminal through an IC diffusion material to a ring contact. As $I_{sub}$ flows through the resistance of the IC diffusion material, $I_{sub}$ can generate a voltage differential across the IC diffusion material. When the voltage differential created by $I_{sub}*R_{sub}$ is large enough, the voltage differential can forward bias the base-emitter junction of the parasitic BJT within the MOSFET device. Once the base-emitter junction is forward biased, the parasitic BJT becomes operable and current can flow into the base terminal of the parasitic BJT. The base current flows as $I_{sub}$ into the IC diffusion material, which corresponds to the base terminal of the parasitic BJT. The base current component of $I_{sub}$ increases the overall level of sub. The increase in $I_{sub}$ increases the voltage differential across the IC diffusion material, further forward biasing the base-emitter junction of the parasitic BJT. Positive feedback is created by the increase in $I_{sub}$ generating an increased forward biasing of the base-emitter junction of the parasitic BJT, thereby further increasing sub. This positive feedback can cause snapback mode to be a self-sustaining state of operation for the parasitic BJT once initiated.

Referring again to FIG. 2, the N-type material of drain 210a, the P-type material of common IC diffusion material 205, and the N-type material of source 220d form an N-P-N structure. The N-P-N structure is represented as parasitic BJT 265. Parasitic BJT 265 represents the inherent parasitic BJT in the first MOSFET driver of ESD protection system 200. As such, drain 210a functions as a collector terminal, common IC diffusion material 205 functions as a base terminal, and source 220d functions as an emitter terminal for parasitic BJT 265.

An ESD event can occur at drain 210a applying a large voltage potential at drain 210a. The large voltage potential can initiate avalanche breakdown at a P-N junction created at the boundary between drain 210a and common IC diffusion material 205. The initiation of avalanche breakdown can create a flow of current, denoted as $I_{sub}$ 285, from drain 210a through common IC diffusion material 205 into ring contact 225. $R_{sub}$ 275 and $R_{sub}$ 280 each represent a value of a resistance of the common IC diffusion material 205 symmetrically shared by each MOSFET output driver of ESD protection system 200. The flow of $I_{sub}$ 285 through $R_{sub}$ 275 and $R_{sub}$ 280 creates a voltage differential between any point in P-type substrate 205 and contact ring 225 that increases as the point of measurement moves farther from contact ring 225.

In FIG. 2, each of contact ring 225 and source 220d is coupled to a same voltage potential of VSS 260. As $I_{sub}$ 285 flows through common IC diffusion material 205, the voltage potential at a location within common IC diffusion material 205 directly under source 220d is approximately equal to VSS 260+($I_{sub}$ 285*$R_{sub}$ 275). As source 220d is coupled to VSS 260, the P-N junction formed by the boundary between source 220d and common IC diffusion material 205 is forward biased by a voltage potential approximately equal to $I_{sub}$ 285*$R_{sub}$ 275. In addition, the boundary between common IC diffusion material 205 and source 220d forms a base-emitter junction of parasitic BJT 265. Accordingly, as $I_{sub}$ 285*$R_{sub}$ 275 increases, the base-emitter junction of parasitic BJT 265 becomes forward biased, thereby enabling parasitic BJT 265.

Enabling parasitic BJT 265 initiates snapback mode in the first MOSFET output driver. A positive feedback loop is created as the enabled parasitic BJT 265 begins to source base current which increases $I_{sub}$ 285. Increased $I_{sub}$ 285 further increases the forward biasing of the base-emitter junction of parasitic BJT 265. The increased forward biasing of the base-emitter junction further enables parasitic BJT 265. The positive feedback that occurs during snapback mode can decrease the response time necessary to enable parasitic BJT 265 during the ESD event at drain 210a. Additionally, the feedback loop increases the rate at which large currents generated during the ESD event can be directed through parasitic BJT 265, thereby bypassing other devices.

The large current-carrying capacity of a parasitic BJT allows smaller sized MOSFET devices to be used as ESD protection devices. Smaller MOSFET devices require less IC area, thereby allowing ESD protection circuit 200 to be implemented using even less area of the IC.

In order to induce snapback mode in a MOSFET device, the value of $R_{sub}$ of the MOSFET device must be large enough to generate a voltage differential across the base-emitter junction of the parasitic BJT that forward biases the base-emitter junction. Forward biasing the base emitter junction must occur responsive to small quantities of $I_{sub}$ passing through $R_{sub}$. Within common IC diffusion material 205, the value of $R_{sub}$ increases as a particular drain terminal, or particular area directly beneath the drain terminal, moves farther away from the contact ring 225. For example, contact ring 225 couples common IC diffusion material 205 to VSS 260. As any of drains 210a, 210b, 215a and 215b move farther from contact ring 225, the value of $R_{sub}$ increases as the current path from a point on contact ring 225 to a particular drain terminal lengthens.

In further illustration, when $R_{sub}$ is analyzed in two dimensions and a value of $R_{sub}$ is calculated relative to the left portion of contact ring contact 225 adjacent to source 220a, drain 215a has a larger value of $R_{sub}$ than drain 210b. The value of $R_{sub}$ is larger from drain 215a because the current path from the left portion of ring contact 225 to drain 215a is longer than the current path from the left portion of contact ring 225 to drain 210b. In reality, the calculated value of $R_{sub}$ is a function of a three dimensional analysis of the resistance of the current path from a particular point on a drain terminal of a MOSFET output driver to all points (or contacts) of contact ring 225 surrounding the MOSFET output drivers. As contacts can be distributed along the perimeter surrounding the MOSFET output drivers, the value of $R_{sub}$ at a particular point depends upon a composite distance from that point to all locations along contact ring 225. Accordingly, the value of $R_{sub}$ for a particular point in common IC diffusion material 205 increases as that particular point moves closer to the centroid of the perimeter surrounding the MOSFET output drivers and, therefore, farther from contact ring 225.

The term "centroid," as used within this specification, refers to an intersection of an X axis of symmetry and a Y axis of symmetry for the perimeter surrounding both MOSFET output drivers, where the X axis is perpendicular to the Y axis. As used within this specification, an "axis of symmetry" for an area within a defined perimeter refers to a line that is located to separate the area into two equal halves of the active portion of the area. More particularly, one-half of the active portion of the area resides on one side of the line while the other half of the active portion of the area resides on the other side of the line.

The value of $R_{sub}$ increases at a particular location within common IC diffusion material 205 as that location moves closer to the centroid of the perimeter. Accordingly, a parasitic BJT associated with a drain terminal closest to the centroid of the perimeter has the highest probability of achieving snapback mode when an ESD event occurs. As a MOSFET output driver becomes smaller, the centroid of the MOSFET output driver moves closer to the perimeter and the value of $R_{sub}$ for the MOSFET output driver decreases. With $R_{sub}$ decreased, the probability that the MOSFET output driver operates in snapback mode during an ESD event generally decreases.

Conventionally, within a smaller MOSFET output driver, dummy devices are placed within the common IC diffusion material to increase the distance from a particular location on a drain terminal at the centroid of the perimeter to the contact ring. Use of dummy devices can increase the value of $R_{sub}$ for that location and increase the probability that snapback mode is achieved in a parasitic BJT at the location during an ESD event.

As used within this specification, the phrase "dummy device(s)" refers to additional MOSFET device(s), or device finger(s), positioned adjacent to a MOSFET output driver within an IC diffusion material. A dummy device is unnecessary to fulfill the drive requirements of the MOSFET output driver. Typically, each drain terminal of the dummy device is coupled to the drain terminal of the MOSFET output driver. Each source terminal of the dummy device is coupled to the source terminal of the MOSFET output driver. However, each gate terminal of the dummy device is not coupled to the signal driving the gate terminal of the MOSFET output driver.

For example, a conventional MOSFET output driver may require 50μ of channel width to drive a 10 pF load. To assure that the value of $R_{sub}$ of the MOSFET output driver is large enough to initiate snapback mode in the MOSFET output driver, an additional 50μ of channel width can be added as a "dummy device." The extra 50μ is typically implemented as additional device fingers or MOSFET devices positioned as close to the centroid of the contact ring as possible. In that case, the initial 50μ of channel width for the MOSFET output driver is necessary to drive the load. The additional 50μ of channel width is a dummy device added only to increase $R_{sub}$. The increased value of $R_{sub}$ can assure that snapback mode is initiated in the MOSFET output driver during an ESD event. As conventionally implemented, dummy devices can consume IC area without providing functional value to the IC.

By arranging two or more MOSFET output drivers to symmetrically share common IC diffusion material 205, surrounded by contact ring 225, ESD protection system 200 can generate a common value of $R_{sub}$ for each MOSFET output driver that is sufficient to initiate snapback mode during an ESD event. ESD protection system 200 provides snapback mode ESD protection to each MOSFET output driver without the use of dummy devices. The lack of dummy devices within ESD protection system 200 can reduce the die area required to provide ESD protection to a MOSFET output driver by as much a 50%. Reduced die area further decreases manufacturing costs for an IC implementing ESD protection system 200.

In another embodiment, ballasting resistors can be implemented for each drain terminal, e.g., drains 210a, 210b, 215a, and 215b. Ballasting resistors can reduce the likelihood of damage to a MOSFET output driver during an ESD event when the parasitic BJTs, e.g., parasitic BJTs 265 and 270, within the MOSFET output drivers are driven into snapback mode. As used within this specification, "ballasting" refers to increasing a distance between a drain connection and a gate edge of a MOSFET device. A silicided metal layer is also blocked or removed from the increased spacing between the drain edge and the gate edge within the MOSFET device. The lack of metal silicide in the extra spacing between the drain and gate edge increases the drain resistance associated with each ballasted MOSFET device or device finger.

The additional drain resistance from ballasting creates a voltage drop at the drain terminal of each MOSFET output driver that increases as ESD current increases during snapback mode operation. The voltage drop forces the voltage across the drain terminal of the parasitic BJT associated with each MOSFET output driver lower, thereby making snapback more difficult to maintain. The drain resistance prevents ESD current from crowding into any one particular drain terminal of the MOSFET output driver to the exclusion of, or while significantly less current flows into, the other drain terminals of the MOSFET output driver since more current in an individual parasitic BJT forces the voltage across that individual parasitic BJT lower. Thus, ballasting each drain terminal protects the MOSFET output driver from damage by excessive ESD current.

Ballasting also protects the MOSFET output driver from failure caused by current crowding associated with bipolar snapback by a singular ESD event. Ballasting increases the probability that the MOSFET output driver can sustain multiple ESD events and still retain functionality.

Figure 3:
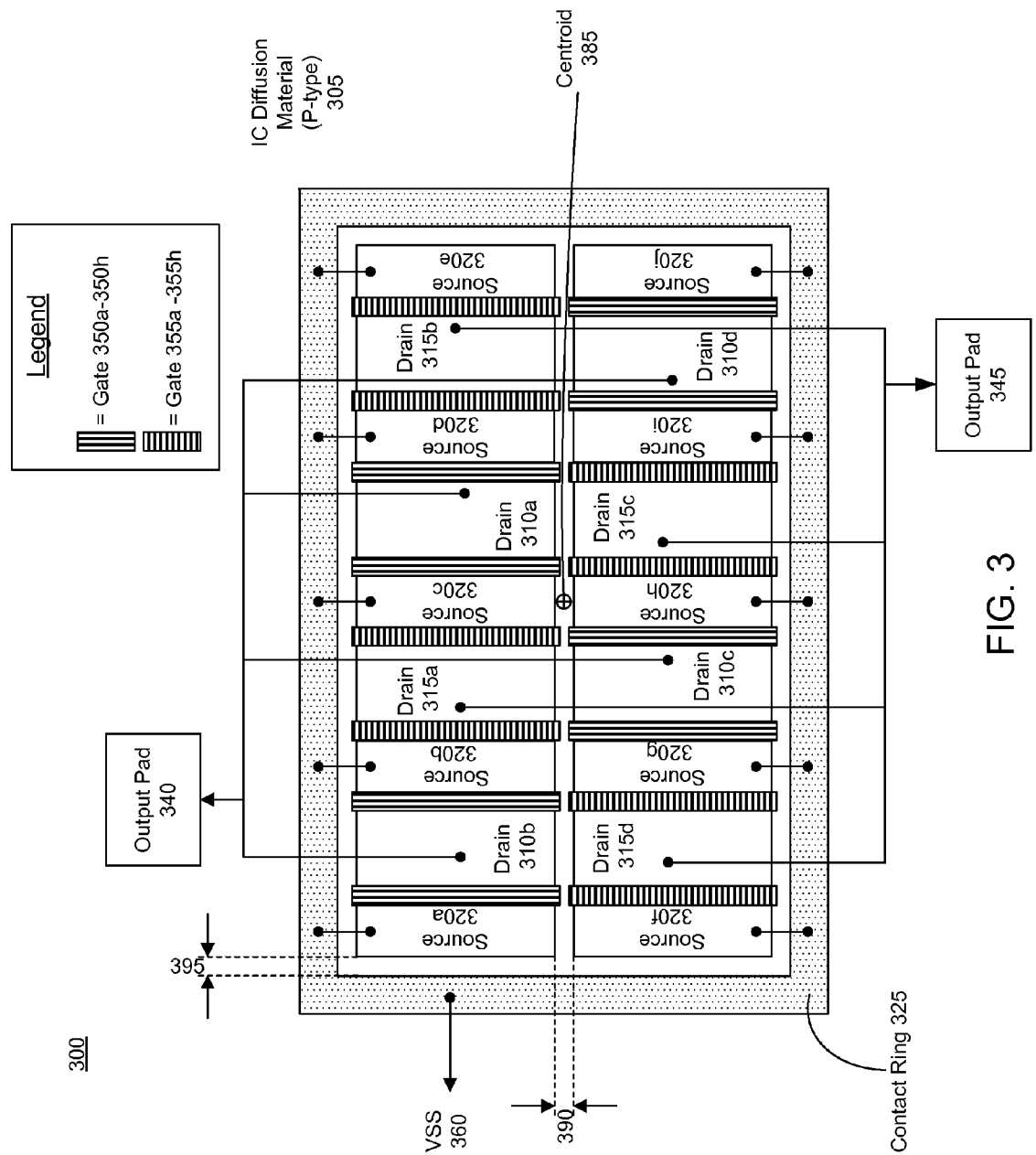
FIG. 3 is a third schematic diagram illustrating a topographical surface view of an IC including an ESD protection system in accordance with another embodiment of the present invention.

FIG. 3 is a third schematic diagram illustrating a topographical surface view of a pair of MOSFET output drivers of ESD protection system 300 in accordance with another embodiment of the present invention. FIG. 3 illustrates a view of ESD protection system 300 implemented with two rows of device terminals. Each row of device terminals is implemented in a manner substantially similar to that described with reference to FIG. 2.

Viewed topographically, ESD protection system 300 contains two rows of drain and source terminals, for two MOSFET output drivers, interdigitated within contact ring 325 so as to symmetrically share IC diffusion material 305. As known in the art, a MOSFET device is conventionally implemented as a device having a single drain, a single source, and a single gate. The single gate MOSFET device can only be enlarged in one dimension by increasing the width of the device. Increasing the width of a MOSFET device can lead to wide MOSFET devices that are often impractical to position within an IC layout. To avoid large layouts, a MOSFET device can be implemented with multiple parallel gates and alternating drain and source terminals. A multi-gate MOSFET device is generally more symmetric in terms of length and width than a single gate MOSFET device.

Conventionally, the term "fingers" refers to a number of gates contained within a particular MOSFET device. As used within this specification, the phrase "interdigitated MOSFET devices" refers to a multi-fingered MOSFET device with alternate fingers coupled together to function as two separate MOSFET devices within a single MOSFET layout structure. Two inputs are coupled to alternating gate terminal pairs of the interdigitated MOSFET device to form two distinct input nodes. Source terminals of the interdigitated MOSFET device are shared by the MOSFET device pair. Alternate drain terminals of the interdigitated MOSFET device are coupled to form two distinct nodes of the IC. Thus, a single MOSFET structure can function as two separate MOSFET devices. Using interdigitation, a MOSFET device pair can be implemented that shares a common centroid.

As pictured in FIG. 3, the first MOSFET output driver of ESD protection system 300 includes drains 310a, 310b, 310c, and 310d coupled in parallel to output pad 340. Although not shown in FIG. 3 for greater clarity, gates 350a-350h are coupled in parallel to a first input. Upon an appropriate voltage being applied to the first input, and thus gates 350a-350h, current flows from drain 310a to sources 320c and 320d, from drain 310b to sources 320a and 320b, from drain 310c to sources 320g and 320h, and from drain 310d to sources 320i and 320j. As such, drains 310a-310d, gates 350a-350h, and sources 320a-320d and 320g-320j, operate as a single NFET device to implement the first MOSFET output driver coupled to output pad 340. Similarly, drains 315a-315d, gates 355a-355h coupled to a second input, and sources 320b-320i can operate as a single NFET device to implement the second MOSFET output driver. Again, for the sake of clarity, the coupling of gates 355a-355h in parallel to the second input is not shown in FIG. 3.

Although embodied with two rows of device terminals in FIG. 3, each MOSFET output driver can be implemented to include one or more rows of device terminals. As such, the embodiments disclosed within this specification are not intended to be limited to a particular number of rows of device terminals. The determination of how many rows of MOSFET device terminals to use and how many MOSFET device terminals to include in each row for ESD protection system 300 can be influenced by a number of factors. These factors can include, for example, the area available within an IC layout for ESD protection system 300, process characteristics of the manufacturing process used to implement the IC, the need to attain a sufficient value of $R_{sub}$ for each MOSFET output driver to assure that bipolar snapback can be initiated in the MOSFET output driver during an ESD event, and the like.

Each MOSFET output driver, when analyzed individually, has a centroid at centroid 385. Centroid 385 represents the centroid of an area defined by a perimeter surrounding both MOSFET output drivers. Contact ring 325 can be arranged along the outer edge of the perimeter surrounding both MOSFET output drivers. Contact ring 325 and each of sources 320a-320j is coupled to VSS 360, i.e., a lowest voltage potential supplying the IC. A distance corresponding to process space 390 can separate each row of MOSFET device terminals. A distance corresponding to process space 395 can separate each row of device terminals from contact ring 325. As known in the art, process spaces 390 and 395 represent a minimum design rule spacing between devices required in typical modern IC manufacturing processes. As such, process spaces 390 and 395 can vary according to the IC manufacturing process used to implement ESD protection system 300.

Interdigitating MOSFET device terminals for each MOSFET output driver and arranging the centroid of each MOSFET output driver to be co-located with centroid 385 helps ensure that the value of $R_{sub}$ of each MOSFET output driver within the symmetrically shared IC diffusion material 305 is approximately equal. Accordingly, the probability that each MOSFET output driver initiates snapback mode during an ESD event, and the ESD protection capability of each MOSFET output driver, is approximately equal.

Figure 4:
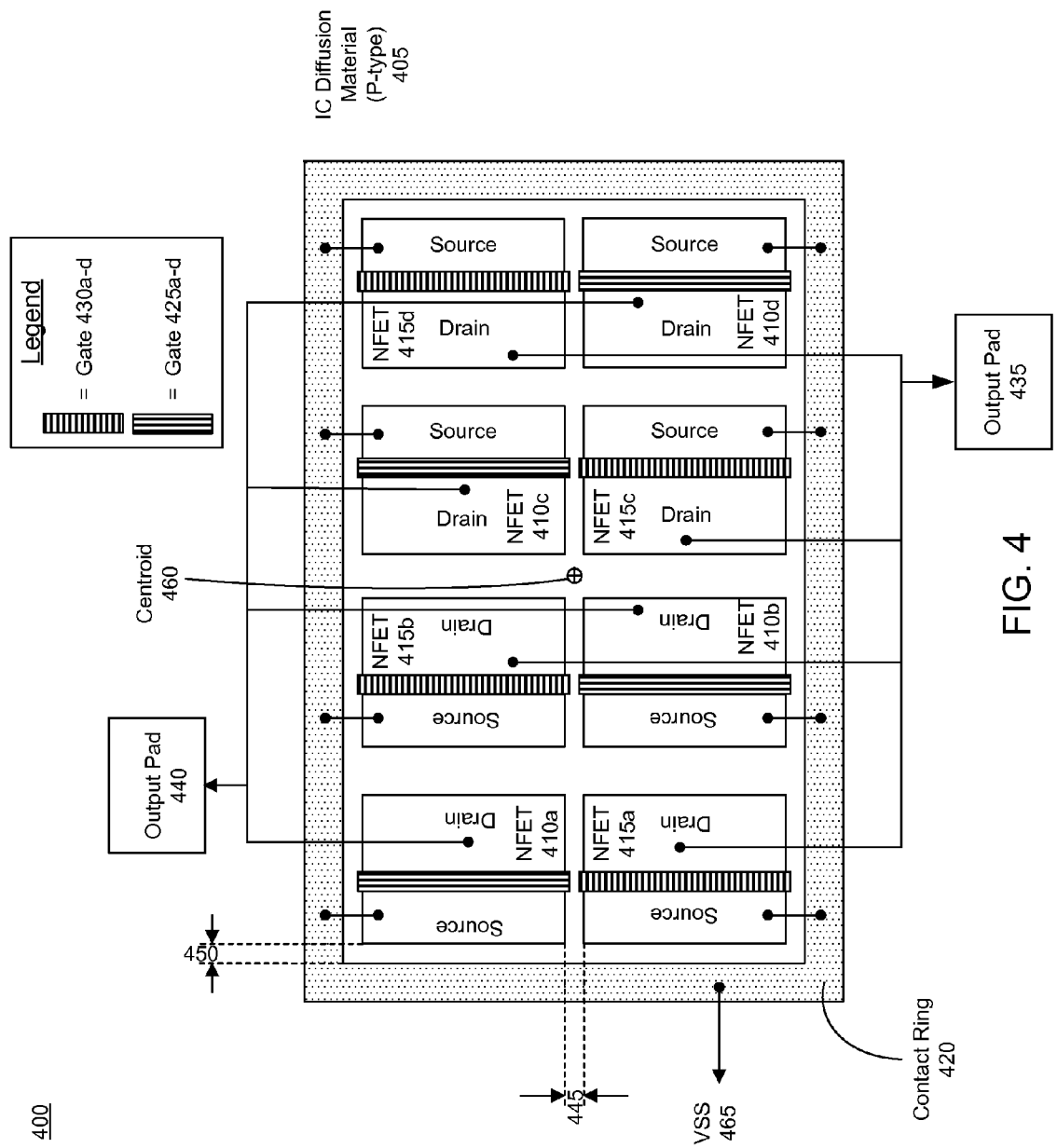
FIG. 4 is a fourth schematic diagram illustrating a topographical surface view of an IC including an ESD protection system in accordance with another embodiment of the present invention.

FIG. 4 is a fourth schematic diagram illustrating a topographical surface view of an IC including an ESD protection system 400 in accordance with another embodiment of the present invention. ESD protection system 400 is implemented with P-type material for the common IC diffusion material 405 that is symmetrically shared by two MOSFET output drivers. Additionally, MOSFET output drivers of ESD protection system 400 are implemented with NFET devices arrays. ESD protection system 400 can include NFETs 410a, 410b, 410c, 410d, 415a, 415b, 415c, and 415d, and contact ring 420.

The two MOSFET output drivers of ESD protection system 400 each can be implemented as a NFET device array. As used within this specification, a "device array" refers to two or more MOSFET devices, whether PFET or NFET, whose like terminals are coupled in parallel in order to function as a single MOSFET device. For example, NFETs 410a-410d form an array of NFET devices that collectively implement a first MOSFET output driver. NFETs 415a-415d form an array of NFET devices that collectively implement a second MOSFET output driver. Within each of a first and a second row of NFET devices within ESD protection system 400, the NFET devices alternate between NFET devices from each NFET array forming each MOSFET output driver.

Each of the NFET device arrays forming each respective MOSFET output driver is arranged to share a common centroid at centroid 460. Centroid 460 represents the centroid of an area defined by a perimeter surrounding both MOSFET output drivers. The drain terminal of each of NFETs 410a-410d is coupled to output pad 440. The drain terminal of each of NFETs 415a-415d is coupled to output pad 435. Gates 425a, 425b, 425c, and 425d can be coupled to each other and serve as an input node to the first MOSFET output driver. Gates 430a, 430b, 430c, and 430d can be coupled to each other and serve as an input node to the second MOSFET output driver. The source terminals of NFETs 410a-410d and 415a-415d are coupled to VSS 465, i.e., the lowest potential supplying the IC.

In another embodiment, each drain terminal of each NFET device within each array of NFET devices for each MOSFET output driver can be ballasted. Ballasting the drain terminal of each NFET device can prevent current crowding from occurring in any particular NFET device of the NFET device arrays for the MOSFET output drivers during an ESD event.

Contact ring 420 can be implemented as a continuous contact ring along the outer edge of the perimeter surrounding both MOSFET output drivers. In another embodiment, a plurality of n-type well contacts can be evenly distributed along the outer edge of the perimeter. Process space 445 refers to a distance that can separate each row of MOSFET devices. Process space 450 refers to a distance that can separate each row of device terminals from the contact ring 420. As noted within this specification, process spaces such as process spaces 445-450 represent a minimum design rule spacing between devices required in typical modern IC manufacturing processes. As such, process spaces 445-450 can vary according to the IC manufacturing processes used to implement ESD protection system 400. Contact ring 420 is coupled to VSS 465. As known in the art, nodes in ESD protection systems should be coupled with robust metal interconnect lines to assure reliable ESD performance.

Figure 5:
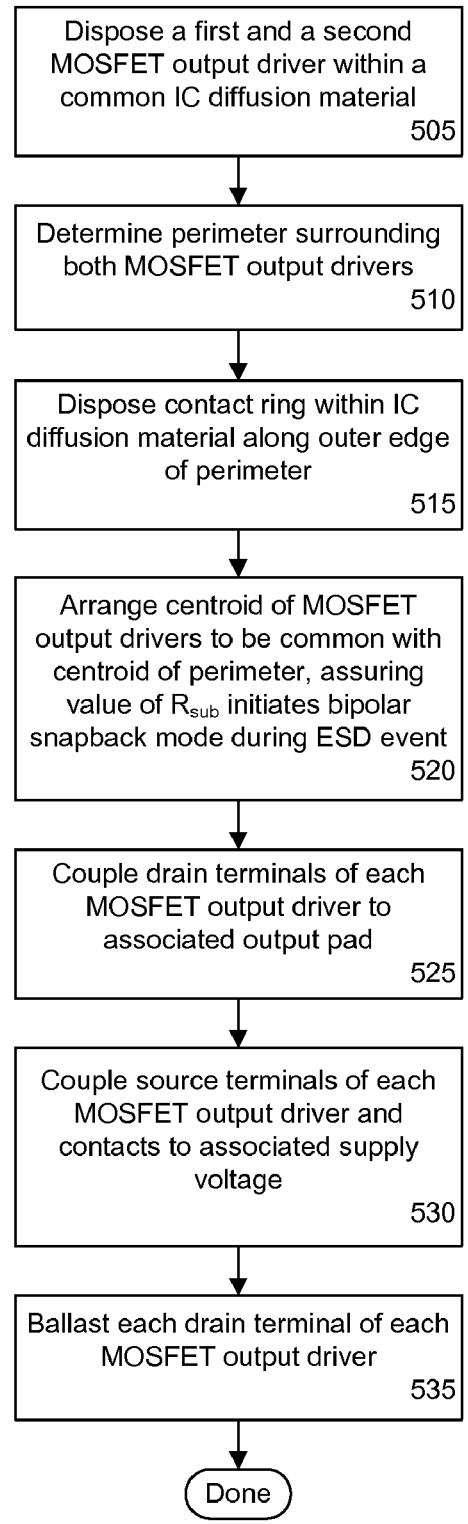
FIG. 5 is a flowchart illustrating a method of protecting an IC from an ESD event in accordance with another embodiment of the present invention.

FIG. 5 is a flowchart illustrating a method 500 of providing ESD protection to an IC in accordance with another embodiment of the present invention. More particularly, method 500 describes a technique for protecting MOSFET output drivers from ESD events.

Accordingly, in step 505, a first MOSFET output driver and a second MOSFET output driver can be arranged to share a common IC diffusion material. In one embodiment, the common IC diffusion material can be a P-type material. In another embodiment, the common IC diffusion material can be an N-type material and, more specifically, an N-type well. The MOSFET output drivers, or terminals of the MOSFET output drivers, can be placed adjacent to each other and alternated such that each of the MOSFET output drivers shares a common centroid. By symmetrically sharing the common IC material, the value of $R_{sub}$ for each MOSFET output driver is increased and approximately equal.

In step 510, a perimeter of an area surrounding both MOSFET output drivers can be determined. In step 515, a contact ring can be disposed within the common IC diffusion material along an outer edge of the perimeter of the area surrounding both MOSFET output drivers. In one embodiment, a single contact that encircles the outer edge of the perimeter of the area surrounding both MOSFET output drivers can be used. In another embodiment, a plurality of contacts can be evenly distributed along the outer edge of the perimeter.

In step 520, a centroid of each MOSFET output driver can be arranged to be common with a centroid of the perimeter surrounding both MOSFET output drivers. The resulting composite distance from the contact ring to a drain terminal within each MOSFET output driver must generate a value of $R_{sub}$ in each MOSFET output driver sufficient to initiate bipolar snapback mode in the MOSFET output driver during an ESD event applied to an output pad coupled to the MOSFET output driver.

In step 525, each drain terminal of each MOSFET output driver can be coupled to an output pad associated with the MOSFET output driver. In step 530, each source terminal of each MOSFET output driver and the contact ring can be coupled to a supply voltage associated with the common IC diffusion material. For example, N-type material is typically coupled to a highest voltage potential supplied to the IC and P-type material is typically coupled to a lowest voltage potential supplied the IC. In step 535, each drain terminal of each MOSFET output driver can be ballasted.

The flowcharts in the figures illustrate the architecture, functionality, and operation of possible implementations of systems and/or methods according to various embodiments of the present invention. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and computer instructions.

The different devices used to implement the exemplary circuits disclosed within this specification are for descriptive purposes only and are not meant to be limiting. It should be appreciated that circuits implemented with a particular device type disposed within a particular semi-conductor material often can be implemented with a complementary architecture. For example a circuit implemented with an NFET device disposed within a P-type substrate can be implemented with a PFET device disposed within an N-type well. Additionally, devices can be disposed within multi-well structures, e.g., a P-type well disposed within an N-type well disposed within a P-type substrate, with differing concentrations of dopant within the semiconductor material of which each well is comprised.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A system for protecting metal oxide semiconductor field effect transistor (MOSFET) output drivers within an integrated circuit (IC) from an electrostatic discharge (ESD) event, the system comprising:
   a first MOSFET output driver and a second MOSFET output driver disposed within a common IC diffusion material; and
   a contact ring disposed within the common IC diffusion material and arranged along an outer edge of a perimeter surrounding the first MOSFET output driver and the second MOSFET output driver, wherein a centroid of each MOSFET output driver is common with a centroid of the perimeter surrounding the first MOSFET output driver and the second MOSFET output driver,
   wherein each MOSFET output driver has a value of substrate resistance ($R_{sub}$) that initiates bipolar snapback in the MOSFET output driver at which an ESD event occurs, and
   wherein the value of $R_{sub}$ depends upon a composite distance from the centroid of each MOSFET output driver to the contact ring.

2. The system of claim 1, wherein:
   the first MOSFET output driver and the second MOSFET output driver each comprises a same number of drain terminals,
   the number of drain terminals is greater than one, and
   the drain terminals of the first MOSFET output driver and the second MOSFET output driver are interdigitated.

3. The system of claim 2, wherein each of the plurality of drain terminals of each of the MOSFET output drivers is ballasted.

4. The system of claim 1, wherein:
   the first MOSFET output driver and the second MOSFET output driver each comprises a same number of source terminals, and
   the number of source terminals is greater than one.

5. The system of claim 1, wherein the contact ring and each source terminal of each MOSFET output driver are coupled to a voltage associated with a particular diffusion type of the common IC diffusion material.

6. The system of claim 5, wherein:
   the common IC diffusion material is a P-type material,
   each MOSFET output driver is an NFET device, and
   the contact ring and each source terminal of each MOSFET output driver are coupled to a lowest voltage potential supplying the IC.

7. The system of claim 5, wherein:
   the common IC diffusion material is an N-type material,
   each MOSFET output driver is a PFET device, and
   the contact ring and each source terminal of each MOSFET output driver are coupled to a highest voltage potential supplying the IC.

8. The system of claim 1, further comprising a first output pad coupled to at least one drain terminal of the first MOSFET output driver and a second output pad coupled to at least one drain terminal of the second MOSFET output driver.

9. A system for protecting metal oxide semiconductor field effect transistor (MOSFET) output drivers within an integrated circuit (IC) from an electrostatic discharge (ESD) event, the system comprising:
   a first MOSFET output driver and a second MOSFET output driver positioned within a common IC diffusion material, wherein each MOSFET output driver comprises an array of a MOSFET devices;
   wherein the MOSFET devices are positioned adjacent to each other;
   wherein adjacent MOSFET devices alternate between MOSFET devices for the first MOSFET output driver and MOSFET devices for the second MOSFET output driver; and
   a contact ring disposed within the common IC diffusion material and arranged along an outer edge of a perimeter surrounding the first and second MOSFET output drivers, wherein a centroid of each array of MOSFET devices is common with a centroid of the perimeter surrounding the first and the second MOSFET output driver,
   wherein each MOSFET output driver has a value of substrate resistance ($R_{sub}$) that initiates bipolar snapback in the MOSFET output driver at which an ESD event occurs, and
   wherein the value of $R_{sub}$ depends upon a composite distance from the centroid of each MOSFET output driver to the contact ring.

10. The system of claim 9, wherein each drain terminal of each MOSFET device is ballasted.

11. The system of claim 9, wherein the contact ring and a source terminal of each MOSFET device are coupled to a voltage associated with a particular diffusion type of the common IC diffusion material.

12. The system of claim 11, wherein;
    the common IC diffusion material is a P-type material,
    each MOSFET output driver is an NFET device, and
    the contact ring and a source terminal of each MOSFET device are coupled to a lowest voltage potential supplying the IC.

13. The system of claim 11, wherein:
    the common IC diffusion material is an N-type material,
    the MOSFET output driver is a PFET device, and
    the contact ring and a source terminal of each MOSFET device are coupled to a highest voltage potential supplying the IC.

14. A method of electrostatic discharge (ESD) protection for metal oxide semiconductor field effect transistor (MOSFET) output drivers within an integrated circuit (IC), the method comprising:
    disposing a first MOSFET output driver and a second MOSFET output driver within a common IC diffusion material;
    determining a perimeter surrounding the first and the second MOSFET output drivers;
    disposing a contact ring within the common IC diffusion material along an outer edge of the perimeter; and
    positioning each MOSFET output driver to have a centroid common with a centroid of the perimeter and a value of substrate resistance ($R_{sub}$) that initiates bipolar snapback in the MOSFET output driver at which an ESD event occurs,
    wherein the value of $R_{sub}$ of each MOSFET output driver depends upon a composite distance from the centroid of each MOSFET output driver to the contact ring.

15. The method of claim 14, further comprising implementing each MOSFET output driver with a same number of drain terminals, wherein:
- the number of drain terminals is greater than one, and
- the drain terminals of the MOSFET output drivers are interdigitated.

16. The method of claim 15, further comprising ballasting each of the plurality of drain terminals of each of the MOSFET output drivers.

17. The method of claim 14, further comprising coupling the contact ring and each source terminal of each MOSFET output driver to a voltage associated with a particular diffusion type of the common IC diffusion material.

18. The method of claim 17, wherein:
- the common IC diffusion material is a P-type material,
- each MOSFET output driver is an NFET device, and
- coupling the contact ring and each source terminal of each MOSFET output driver further comprises coupling the contact ring and each source terminal of each MOSFET output driver to a lowest voltage potential supplying the IC.

19. The method of claim 17, wherein:
- the common IC diffusion material is an N-type material,
- each MOSFET output driver is a PFET device, and
- coupling the contact ring and each source terminal of each MOSFET output driver further comprises coupling the contact ring and each source terminal of each MOSFET output driver to a highest voltage potential supplying the IC.

20. The method of claim 14, further comprising:
- coupling a first output pad to at least one drain terminal of the first MOSFET output driver; and
- coupling a second output pad to at least one drain terminal of the second MOSFET output driver.

* * * * *